(12) United States Patent
Rangarajan et al.

(10) Patent No.: US 6,762,133 B1
(45) Date of Patent: Jul. 13, 2004

(54) SYSTEM AND METHOD FOR CONTROL OF HARDMASK ETCH TO PREVENT PATTERN COLLAPSE OF ULTRA-THIN RESISTS

(75) Inventors: Bharath Rangarajan, Santa Clara, CA (US); Ramkumar Subramanian, San Jose, CA (US); Khoi A. Phan, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 302 days.

(21) Appl. No.: 09/911,241

(22) Filed: Jul. 23, 2001

(51) Int. Cl.[7] .............................................. H01L 4/302
(52) U.S. Cl. ...................... 438/745; 134/1.1; 430/313
(58) Field of Search ................................ 438/745, 751, 438/756, 757; 134/1.1, 1.2, 1.3; 430/313–315

(56) References Cited

U.S. PATENT DOCUMENTS

| | | | |
|---|---|---|---|
| 5,670,423 A | | 9/1997 | Yoo ............................ 437/192 |
| 5,741,628 A | * | 4/1998 | Matsuo et al. .............. 430/323 |
| 5,756,254 A | * | 5/1998 | Kihara et al. ............. 430/270.1 |
| 5,866,304 A | * | 2/1999 | Nakano et al. ............. 430/325 |
| 6,020,269 A | | 2/2000 | Wang et al. ................ 438/717 |
| 6,605,413 B1 | * | 8/2003 | Lyons et al. ................ 430/314 |

* cited by examiner

*Primary Examiner*—Kin-Chan Chen
(74) *Attorney, Agent, or Firm*—Amin & Turocy, LLP

(57) ABSTRACT

The present invention relates to systems and methods for mitigating pattern collapse in ultra-thin resist processing. In one embodiment, the present invention relates to etching extremely fine patterns into a hardmask immediately after developing an ultra-thin resist, wherein the resist is not dried.

11 Claims, 5 Drawing Sheets

SYSTEM AND METHOD FOR CONTROL OF HARDMASK ETCH TO PREVENT PATTERN COLLAPSE OF ULTRA-THIN RESISTS

TECHNICAL FIELD

The present invention generally relates to mitigating pattern collapse of ultra-thin resists. In particular, the present invention relates to an etch of a hardmask immediately after developing an ultra-thin resist, and control thereof.

BACKGROUND ART

In the semiconductor industry, there is a continuing trend toward higher device densities. To achieve these high densities, there has been and continues to be efforts toward scaling down the device dimensions on semiconductor wafers. In order to accomplish such high device packing density, smaller and smaller features sizes are required. This includes the width and spacing of interconnecting lines and the surface geometry such as corners and edges of various features. Since numerous interconnecting lines are typically present on a semiconductor wafer, the trend toward higher device densities is a notable concern.

The requirement of small features, such as metal lines, with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, lithography is not without limitations. Patterning features having dimensions of about 0.25 µm, 0.18 µm or less with acceptable resolution is difficult. This is because photoresist layers used in lithography typically have thicknesses on the order of 7,000 Å and higher. Such relatively thick photoresist layers are not conducive to making small patterned dimensions with good resolution.

Using relatively thin photoresists (such as less than about 5,000 Å) enables the patterning of smaller and smaller dimensions. However, insufficient resistance to pattern collapse during post-development rinse and dry cycles is associated with using thin photoresists. Insufficient resistance to pattern collapse is also associated with smaller and smaller pitches (of patterned photoresists). The relatively thin patterned photoresists simply do not withstand the physical strain imposed by the post-development rinse and dry steps. For example, pattern collapse due to water rinse, dry cycles, and spinning action associated with such steps, result in poor pattern transfer. In many instances the relatively thin patterned photoresists are destroyed or partially destroyed during deionized water rinsing. Improved lithography procedures providing improved resolution and improved resistance to pattern collapse are therefore desired.

SUMMARY OF THE INVENTION

The present invention generally provides systems and methods that mitigate the problems associated with pattern collapse, improve critical dimension control and/or improve resolution when using ultra-thin resists. Since it is possible to mitigate the problems associated with ultra-thin photoresist pattern collapse, the present invention provides improved methods for processing layers underneath ultra-thin photoresists including metal layers, dielectric layers, and silicon layers. The methods of the present invention make it possible to consistently process underlying layers through trenches, holes and other openings on the order of about 0.18 µm or less in size. As a result, the present invention effectively addresses the concerns raised by the trend towards the miniaturization of semiconductor devices.

In one embodiment, the present invention relates to a semiconductor processing system containing a processing chamber coupled to a measurement system and a control system and operable to develop an ultra-thin resist and etch a hardmask; a supply of a developer for contact with the ultra-thin resist; a supply of an etch solution; the measurement system for in situ monitoring of patterning the ultra-thin resist and the hardmask and for providing a measurement signal indicative of the measured patterning; and the control system for controlling treatment parameters within the chamber including contact time of the etch solution with the patterned resist and hardmask. The control system adjusts the treatment parameters to control patterning based on the measurement signal.

In another embodiment, the present invention relates to a method of processing an ultra-thin resist, involving depositing the ultra-thin resist over a hardmask layer that is over a semiconductor substrate; irradiating the ultra-thin resist; developing the ultra-thin resist with a developer to form a patterned resist, wherein the ultra-thin resist is not dried; optionally rinsing the patterned resist with water, and etching the hardmask layer with an etch solution within about 1 minute after developing to provide a patterned hardmask. The method may further include controlling treatment parameters using a control system and a measurement system.

DISCLOSURE OF THE INVENTION

Figure 1:
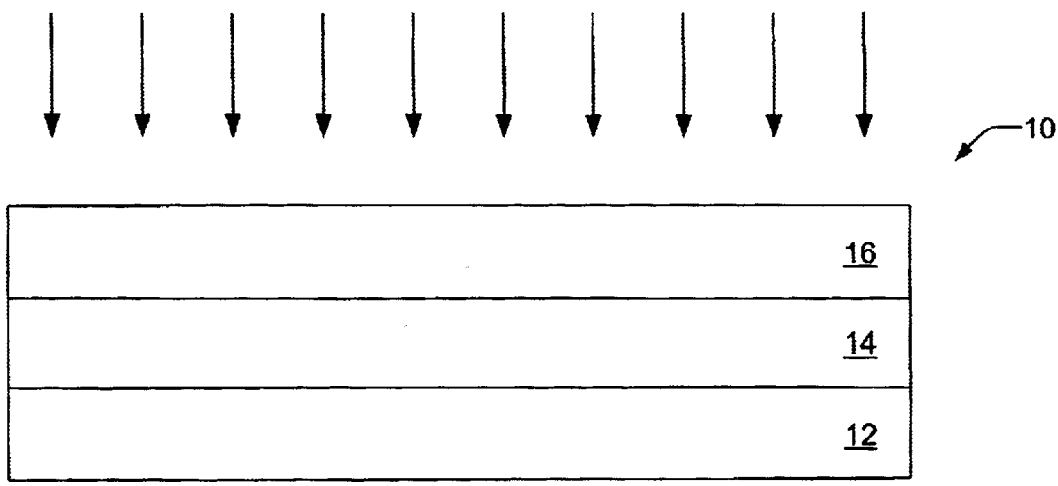
FIG. 1 illustrates a cross-sectional view of a semiconductor structure processed according to one aspect of the present invention.

The present invention involves systems and methods for etching extremely fine patterns into a hard mask while developing an ultra-thin resist to mitigate problems of pattern collapse. The present invention more specifically involves developing an irradiated ultra-thin resist and wet etching the underlying hardmask layer in the same step to enable high resolution patterning of the underlying hardmask layer having features on the order of about 0.18 $\mu$m or less, and even about 0.13 $\mu$m or less. Since the hardmask is patterned at substantially the same time the ultra-thin resist is developed (that is, immediately thereafter), drying and rinsing the ultra-thin resist are not necessary, and thus the problems associated with drying and rinsing an ultra-thin resist, such as pattern collapse, are eliminated. In subsequent processing, the hardmask is much more durable as a mask than the ultra-thin resist. The present invention therefore promotes advancement in the trend toward higher device densities.

As a result of the present invention, pattern collapse of ultra-thin resists due to at least one of water rinse, drying, and torsional spinning forces is improved. Mitigating and/or eliminating the problems associated with pattern collapse permits the more frequent use of ultra-thin resists in processing underlying layers with preciseness. Resolution and critical dimension control are also improved by the use of ultra-thin resists.

A hardmask is initially provided over a semiconductor substrate to be processed using an ultra-thin resist. The semiconductor substrate may include any suitable semiconductor material (one or more layers of semiconductor materials), for example, a monocrystalline silicon substrate. Semiconductor substrates may include of one or more layers including substrate layers, diffusion regions, dielectric layers such as oxides and nitrides, metal layers, devices, polysilicon layers, and the like (all of which are collectively termed semiconductor layers), which may further include various electrical devices. The top layer of the semiconductor substrate serves as the underlying layer once the hardmask and an ultra-thin resist layer is formed thereover.

The hardmask is composed of a material that may be etched with a solution inside the developer cup. Examples of hardmask materials include oxides, nitrides, and metal containing materials. Oxide hardmasks include silicon dioxide, fluorine doped silicon glass (FSG), tetraethylorthosilicate (TEOS), phosphosilicate glass (PSG), borophosphosilicate glass (BPSG), borophosphotetraethylorthosilicate (BPTEOS), and the like. Nitride hardmasks include silicon nitride and silicon oxynitride. Metal containing materials include titanium, titanium nitride, tungsten, tantalum, tantalum nitride.

Hardmasks in accordance with the present invention have a thickness of about 5,000 Å or less. The hardmask is suitably thin to act as a mask for patterning small features. In one embodiment, the hardmask has a thickness of about 100 Å or more and about 5,000 Å or less. In another embodiment, the hardmask has a thickness of about 200 Å or more and about 3,000 Å or less. In yet another embodiment, the hardmask has a thickness of about 300 Å or more and about 2,000 Å or less.

An ultra-thin resist is provided over the hardmask. The ultra-thin resist is deposited over the semiconductor substrate using any suitable technique. For example, an ultra-thin photoresist is deposited using conventional spin-coating or spin casting techniques.

Ultra-thin resists in accordance with the present invention have a thickness of about 5,000 Å or less. In one embodiment, the ultra-thin resist layer has a thickness of about 200 Å or more and about 5,000 Å or less. In another embodiment, the ultra-thin resist layer has a thickness of about 300 Å or more and about 3,000 Å or less. In yet another embodiment, the ultra-thin resist layer has a thickness of about 400 Å or more and about 2,500 Å or less.

The ultra-thin resist layer has a thickness suitable for forming patterns or openings in the hardmask that are about 0.18 $\mu$m or less, or even about 0.15 $\mu$m or less. As a result, processing the layer under the hardmask is facilitated by the ability to fabricate small features. Processing the underlying layer includes one or more of etching, implantation, deposition, or other operations. Since the ultra-thin resist layer is relatively thin compared with I-line photoresists and other photoresists, improved critical dimension control is realized.

Ultra-thin resists are typically processed using small wavelength radiation. As used herein, small wavelength radiation means electromagnetic radiation having a wavelength of about 250 nm or less, including e-beams and X-rays. In one embodiment, small wavelength radiation includes electromagnetic radiation having a wavelength of about 200 nm or less. In another embodiment, small wavelength radiation includes extreme UV electromagnetic radiation having a wavelength of about 160 nm or less. In yet another embodiment, small wavelength radiation includes extreme UV electromagnetic radiation having a wavelength of about 15 nm or less, including e-beams and X-rays.

Small wavelength radiation increases precision and thus the ability to improve critical dimension control and/or resolution. Specific examples of wavelengths to which the ultra-thin resists are sensitive (undergo chemical transformation enabling subsequent development) include about 248 nm, about 193 nm, about 157 nm, about 13 nm, about 11 nm, about 1 nm, and e-beams. Specific sources of radiation include KrF excimer lasers having a wavelength of about 248 nm, a XeHg vapor lamp having a wavelength from about 200 nm to about 250 nm, mercury-xenon arc lamps having a wavelength of about 248 nm, an ArF excimer laser having a wavelength of about 193 nm, an $F_2$ excimer laser having a wavelength of about 157 nm, extreme UV light having wavelengths of about 13.5 nm and/or about 11.4 nm, and X-rays having a wavelength of about 1 nm.

Positive or negative ultra-thin photoresists may be employed in the methods of the present invention. General examples of ultra-thin resists include those containing a partially t-butoxycarbonyloxy substituted poly-p-phydroxystyrene, melamine-formaldehyde polymers, polyvinylpyrrolidone, polymethylisoprenylketone, a novolak, a polyvinylphenol, polymers of hydroxystyrene and acrylate, methacrylate polymers or a mixture of acrylate polymers and methacrylate polymers. Further specific examples include poly(p-tert-butoxycarbonyloxy-α-methylstyrene), poly(p-tert-butoxycarbonyloxystyrene), poly(tert-butyl p-vinylbenzoate), poly(tert-butyl p-isopropenylphenyloxyacetate), and poly(tert-butyl methacrylate). Resists are commercially available from a number of sources, including Shipley Company, Kodak, Hunt, Arch Chemical, Clariant, Aquamer, JSR Microelectronics, Hoechst Celanese Corporation, and Brewer.

After the ultra-thin resist is deposited over the hardmask, the structure including the semiconductor substrate, hardmask, and ultra-thin resist is optionally heated. Heating serves to promote removal of excess solvent employed to deposit the ultra-thin resist over the hardmask.

The ultra-thin resist layer is then selectively exposed to actinic radiation. In particular, the ultra-thin resist layer is exposed to a pattern of radiation having a relatively small wavelength (for example, less than 250 nm); that is, selected portions of the ultra-thin resist layer are exposed to actinic radiation through a mask, leaving the ultra-thin resist layer with exposed and unexposed portions. Actinic radiation includes relatively small wavelength less than 250 nm and e-beams. A number of exemplary wavelengths are described above in connection with the ultra-thin resists.

Following an image-wise exposure to actinic radiation, the ultra-thin resist layer is developed and the hardmask is immediately etched to provide a patterned hardmask without rinsing, spinning, and drying the ultra-thin resist, thereby mitigating the problems associated with pattern collapse. In other words, the ultra-thin resist layer is developed and the hardmask is etched without drying the ultra-thin resist. Immediately etching the hardmask means that the hardmash is etched with an etching solution within about 1 minute after the ultra-thin resist layer is developed. In another embodiment, immediately etching the hardmask means that the hardmash is etched with an etching solution within about 30 seconds after the ultra-thin resist layer is developed.

The ultra-thin resist layer may be optionally rinsed, for example with deionized water, immediately after development and just prior to etching the hardmask. However, if the ultra-thin resist layer is optionally rinsed, it is not dried. In a preferred embodiment, a liquid (developer, optional rinse, and etching solution) is in constant contact with the structure in a continuous, successive manner.

The selectively exposed ultra-thin resist layer is developed by contact with a suitable developer that removes either the exposed or unexposed portions of the ultra-thin resist layer. The identity of the developer depends upon the specific chemical constitution of the ultra-thin resist layer. Typically, for example, an aqueous alkaline solution may be employed to remove unexposed portions of the ultra-thin resist layer. Alternatively, one or more of dilute aqueous acid solutions, hydroxide solutions, water, organic solvent solutions may be employed to remove selected portions of the ultra-thin resist layer.

After contact with the developer, the structure or treated patterned resist is immediately subjected to an etching solution to remove portions of the hardmask exposed by development. As a result, the patterned ultra-thin resist is removed and portions of the hardmask is patterned.

The composition of the etching solution depends upon the identity of the hardmask material. As previously described, the hardmask materials include oxides, nitrides, and metal containing materials. For oxide hardmasks, the etching solution is one of a buffered oxide etch solution (BOE) or an HF solution. For nitride hardmasks, the etching solution is a phosphoric acid solution. And for metal containing hardmasks, the etching solution is a peroxide solution, such as an aqueous $H_2O_2$ solution.

After the hardmask is patterned, the structure is optionally rinsed with deionized water. Alternatively or additionally, an organic liquid or a stripper solution may be contacted with the structure to completely remove any portions of the ultra-thin resist that may remain on the structure after contact with the hardmask etching solution. As a result of the present invention, a patterned mask with fine features, including a small pitch, can be readily formed.

The present invention is now discussed in conjunction with the Figures. FIGS. 1–6 illustrate various embodiments of the present invention. The procedures described in the Figures may be used with any suitable semiconductor technology including but not limited to NMOS, PMOS, CMOS, BICMOS, bipolar, multi-chip modules (MCM) and III–IV semiconductors.

In one embodiment, referring to FIG. 1, a semiconductor structure 10 including a semiconductor substrate 12 having a hardmask layer 14 thereover is provided. Semiconductor substrate 12 may include any suitable semiconductor material (one or more layers of semiconductor materials), for example, a monocrystalline silicon substrate. Semiconductor substrate 12 may additionally include of one or more layers including substrate layers, diffusion regions, dielectric layers such as oxides and nitrides, devices, polysilicon layers, and the like. The hardmask layer 14 is silicon dioxide and has a thickness of about 1,000 Å or less in this embodiment.

An ultra-thin photoresist layer 16 is then formed over the hardmask layer 14. The ultra-thin photoresist is deposited over the hardmask layer 14 using any suitable technique, such as conventional spin-coating or spin casting techniques. The ultra-thin photoresist layer 16 also has a thickness of about 1,000 Å or less. Since the ultra-thin photoresist layer 16 is relatively thin compared with I-line and other photoresists, improved resolution over I-line photoresists is realized. In this embodiment, the ultra-thin photoresist layer 16 is a positive type deep UV photoresist.

The ultra-thin photoresist layer 16 of the semiconductor structure 10 is then selectively exposed to actinic radiation (shown by the arrows) through a lithography mask (not shown). The ultra-thin photoresist layer 16 is selectively exposed using electromagnetic radiation having a relatively small wavelength (for example, less than 250 nm). In this embodiment, electromagnetic radiation having a wavelength of about 248 nm is employed. The ultra-thin photoresist layer 16 is selectively exposed to radiation; that is, selected portions of the ultra-thin photoresist layer 16 are exposed to radiation (corresponding to the regions directly underneath the openings in the lithography mask) while other portions of the ultra-thin photoresist layer 16 are not exposed (corresponding to the regions directly underneath the lithography mask).

Figure 2:
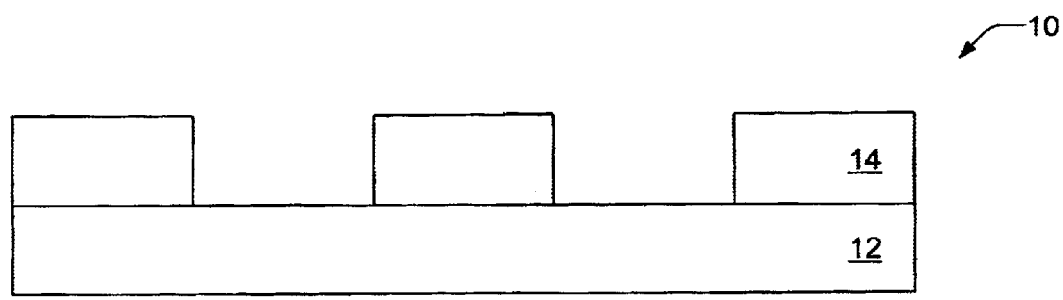
FIG. 2 illustrates a cross-sectional view of a semiconductor structure processed according to one aspect of the present invention.

Referring to FIG. 2, the ultra-thin photoresist layer 16 of the semiconductor structure 10 is developed by contact with a suitable developer that removes the exposed portions of the ultra-thin photoresist layer 16 thereby exposing a portion of the hardmask layer 14 and temporarily providing a patterned ultra-thin photoresist layer. In this embodiment, an aqueous tetrainethylamrnmonium hydroxide solution may be employed to remove exposed portions of the ultra-thin photoresist layer 16. Within about 10 seconds after development, an aqueous HF solution is contacted with the structure 10 wherein exposed portions of the hardmask layer 14 are removed. The ultra-thin photoresist layer 16 is also removed by the acid solution.

As a result of development and acid etching, a pattern is formed in the hardmask layer 14. Deionized water is deposited over the structure 10 (as it is spinning) and specifically over the patterned hardmask layer 14 to remove any residual developer, acid solution, and/or debris. The structure 10 is then optionally subject to soft bake to drive off any water from the surface of the patterned hardmask layer 14. Since the patterned ultra-thin photoresist layer 16 is not subjected to drying or baking, problems associated with pattern collapse are mitigated.

Figure 3:
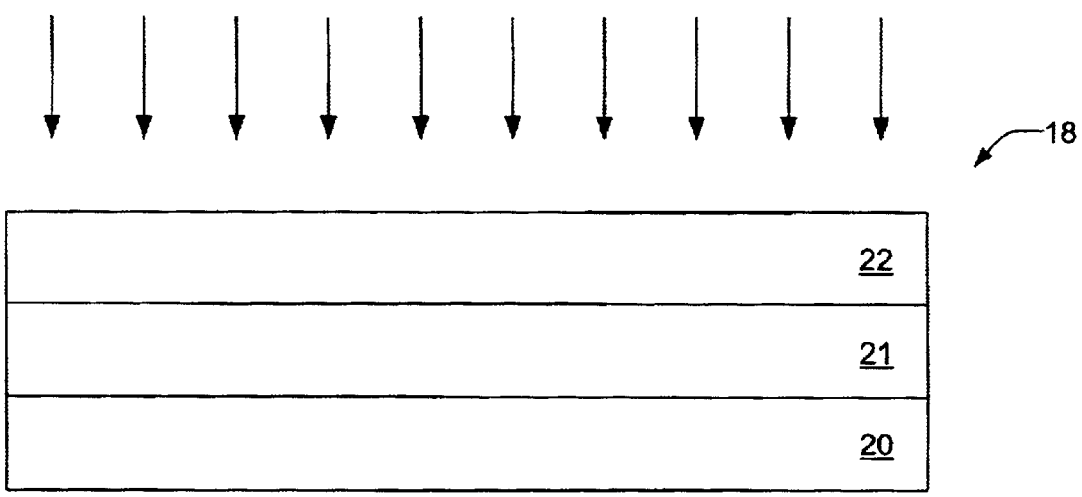
FIG. 3 illustrates a cross-sectional view of a semiconductor structure processed according to another aspect of the present invention.

In another embodiment, referring to FIG. 3, a semiconductor structure 18 including a semiconductor substrate 20 having a hardmask layer 21 thereover is provided. Semiconductor substrate 20 may include any suitable semiconductor material (one or more layers of semiconductor materials), for example, a monocrystalline silicon substrate. Semiconductor substrate 20 may additionally include of one or more layers including substrate layers, diffusion regions, dielectric layers such as oxides and nitrides, devices, polysilicon layers, and the like. The hardmask layer 21 is silicon nitride and has a thickness of about 750 Å or less in this embodiment.

An ultra-thin photoresist layer 22 is then formed over the hardmask layer 21. The ultra-thin photoresist is deposited over the hardmask layer 21 using any suitable technique, such as conventional spin-coating or spin casting techniques. The ultra-thin photoresist layer 22 also has a thickness of about 1,500 Å or less. Since the ultra-thin photoresist layer 22 is relatively thin compared with I-line and other photoresists, improved resolution over I-line photoresists is realized. In this embodiment, the ultra-thin photoresist layer 22 is a positive type photoresist.

The ultra-thin photoresist layer 22 of the semiconductor structure 18 is then selectively exposed to actinic radiation (shown by the arrows) through a lithography mask (not shown). The ultra-thin photoresist layer 22 is selectively exposed using electromagnetic radiation having a relatively small wavelength (for example, less than 200 nm). In this embodiment, electromagnetic radiation having a wavelength of about 193 nm is employed. The ultra-thin photoresist layer 22 is selectively exposed to radiation; that is, selected portions of the ultra-thin photoresist layer 22 are exposed to radiation (corresponding to the regions directly underneath the openings in the lithography mask) while other portions of the ultra-thin photoresist layer 22 are not exposed (corresponding to the regions directly underneath the lithography mask).

Figure 4:
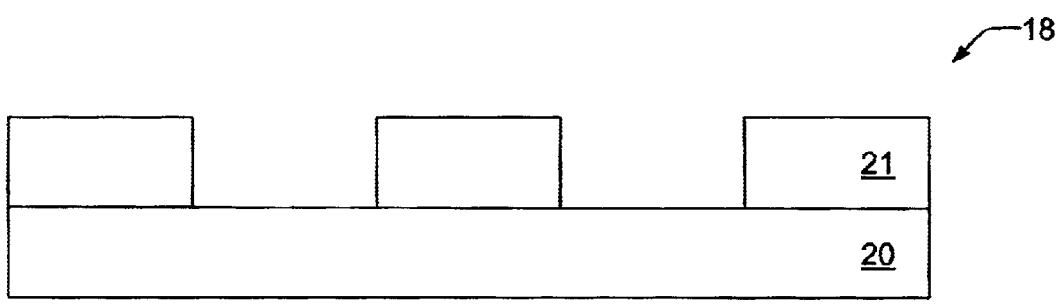
FIG. 4 illustrates a cross-sectional view of a semiconductor structure processed according to another aspect of the present invention.

Referring to FIG. 4, the ultra-thin photoresist layer 22 of the semiconductor structure 18 is developed by contact with a suitable developer that removes the exposed portions of the ultra-thin photoresist layer 16 thereby exposing a portion of the hardmask layer 21 and temporarily providing a patterned ultra-thin photoresist layer. In this embodiment, an aqueous tetramethylammonium hydroxide solution may be employed to remove exposed portions of the ultra-thin photoresist layer 22. The pattened ultra-thin resist is contacted with deionized water for 5 seconds and then within about 5 seconds after development, an aqueous phosphoric acid solution is contacted with the structure 18 wherein exposed portions of the hardmask layer 21 are removed. The ultra-thin photoresist layer 22 is also substantially removed by the acid solution.

As a result of development and acid etching, a pattern is formed in the hardmask layer 21. Deionized water is deposited over the structure 10 (as it is spinning) and specifically over the patterned hardmask layer 21 to remove any residual developer, acid solution, and/or debris. The structure 18 is then optionally subject to soft bake to drive off any water from the surface of the patterned hardmask layer 21. Since the patterned ultra-thin photoresist layer 22 is not subjected to drying or baking, problems associated with pattern collapse are mitigated.

Figure 5:
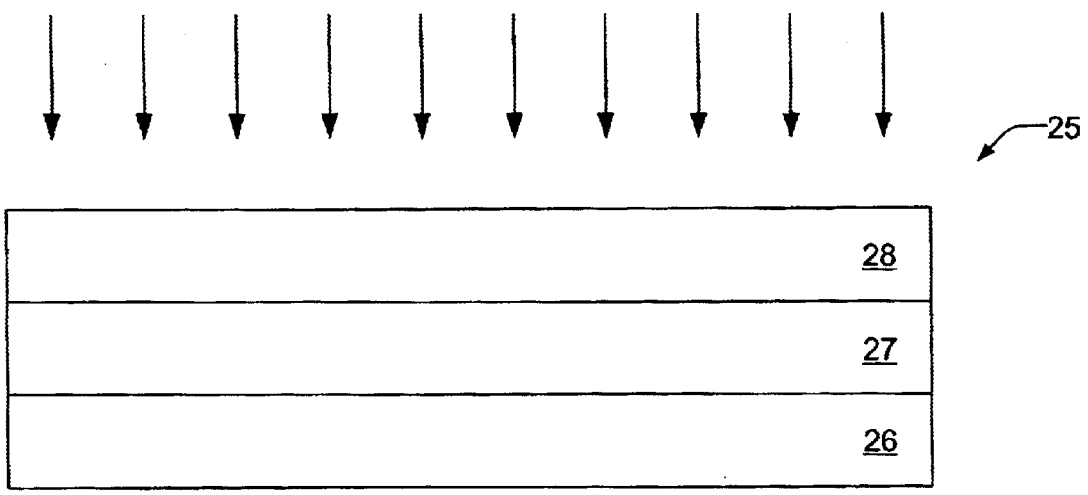
FIG. 5 illustrates a cross-sectional view of a semiconductor structure processed according to yet another aspect of the present invention.

In yet another embodiment, referring to FIG. 5, a semiconductor structure 25 including a semiconductor substrate 26 having a hardmask layer 27 thereover is provided. Semiconductor substrate 26 may include any suitable semiconductor material (one or more layers of semiconductor materials), for example, a monocrystalline silicon substrate. Semiconductor substrate 26 may additionally include of one or more layers including substrate layers, diffusion regions, dielectric layers such as oxides and nitrides, devices, polysilicon layers, and the like. The hardmask layer 27 is titanium nitride and has a thickness of about 1,200 Å or less in this embodiment.

An ultra-thin photoresist layer 28 is then formed over the hardmask layer 27. The ultra-thin photoresist is deposited over the hardmask layer 27 using any suitable technique, such as conventional spin-coating or spin casting techniques. The ultra-thin photoresist layer 28 also has a thickness of about 800 Å or less. Since the ultra-thin photoresist layer 28 is relatively thin compared with I-line and other photoresists, improved resolution over I-line photoresists is realized. In this embodiment, the ultra-thin photoresist layer 28 is a positive type photoresist.

The ultra-thin photoresist layer 28 of the semiconductor structure 25 is then selectively exposed to actinic radiation (shown by the arrows) through a lithography mask (not shown). The ultra-thin photoresist layer 28 is selectively exposed using electromagnetic radiation having a relatively small wavelength (for example, less than 160 nm). In this embodiment, electromagnetic radiation having a wavelength of about 157 nm is employed. The ultra-thin photoresist layer 28 is selectively exposed to radiation; that is, selected portions of the ultra-thin photoresist layer 28 are exposed to radiation (corresponding to the regions directly underneath the openings in the lithography mask) while other portions of the ultra-thin photoresist layer 28 are not exposed (corresponding to the regions directly underneath the lithography mask).

Figure 6:
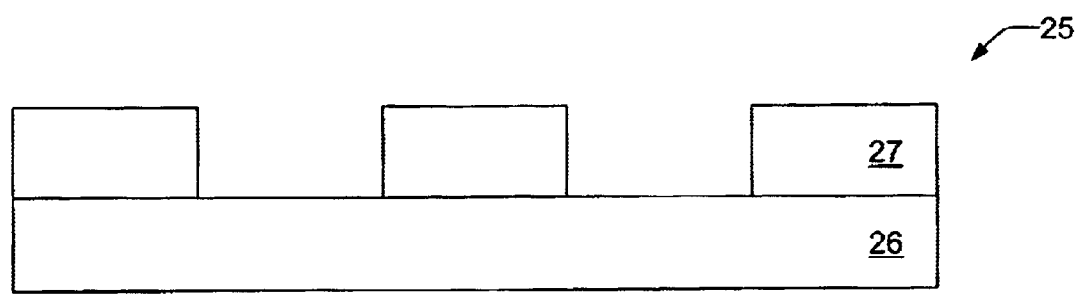
FIG. 6 illustrates a cross-sectional view of a semiconductor structure processed according to yet another aspect of the present invention.

Referring to FIG. 6, the ultra-thin photoresist layer 28 of the semiconductor structure 25 is developed by contact with a suitable developer that removes the exposed portions of the ultra-thin photoresist layer 28 thereby exposing a portion of the hardmask layer 27 and temporarily providing a patterned ultra-thin photoresist layer. In-this embodiment, an aqueous tetramethylammonium solution may be employed to remove exposed portions of the ultra-thin photoresist layer 28. Within about 20 seconds after development, an aqueous hydrogen peroxide solution is contacted with the structure 25 wherein exposed portions of the hardmask layer 27 are removed. The ultra-thin photoresist layer 28 is also removed by the peroxide solution.

As a result of development and peroxide etching, a pattern is formed in the hardmask layer 27. Deionized water is deposited over the structure 25 and specifically over the patterned hardmask layer 27 to remove any residual developer, peroxide solution, and/or debris. The structure 25 is then optionally subject to soft bake to drive off any water from the surface of the patterned hardmask layer 27. Since the patterned ultra-thin photoresist layer 28 is not subjected to drying or baking, problems associated with pattern collapse are mitigated.

Figure 7:
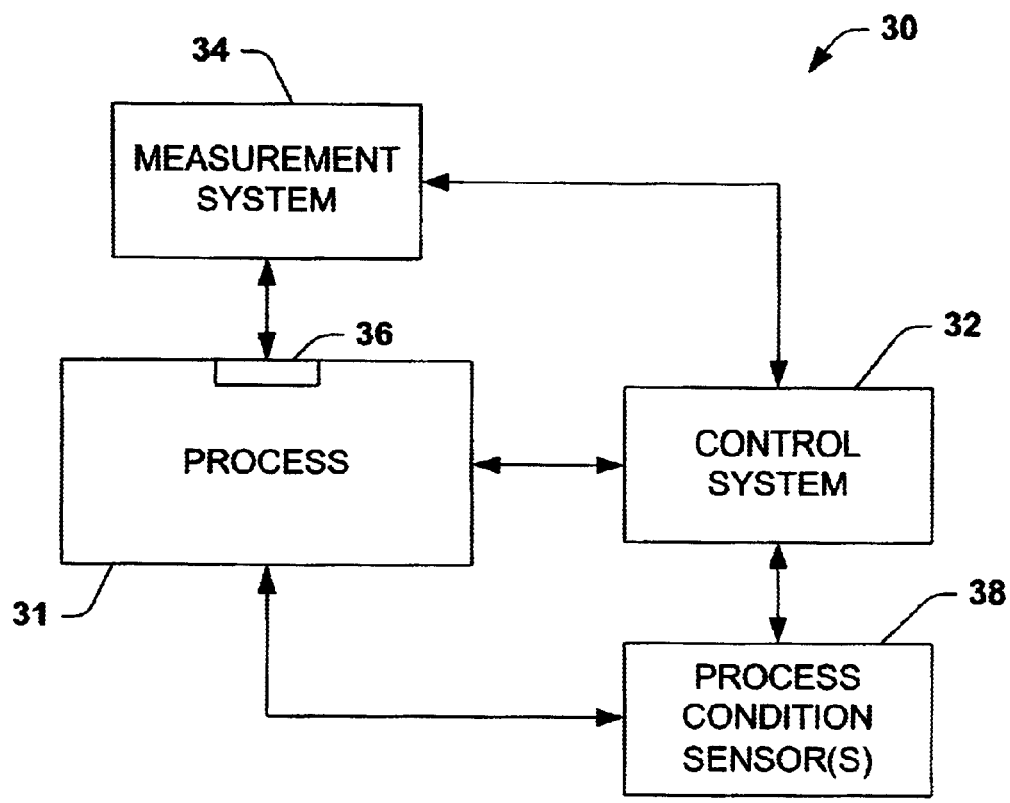
FIG. 7 is a diagramatic block representation of a system in accordance with one aspect of the present invention.

The present invention further relates to systems for in situ developer etch of hardmasks. FIG. 7 illustrates a system 30 for in-situ developer etch of hardmasks in a semiconductor process, schematically indicated at 31. The process 31, for example, includes monitoring resist development and/or hardmask etching.

The system 30 also includes a control system 32 for controlling operating characteristics of the process 31. The operating characteristics associated with the process 31 may include, for example, the temperature, concentration of developer components, concentration of etch solution components, and timing parameters associated with different steps in the patterning process. The control system 32 may adjust one or more selected operating parameters of the process based on sensed operating conditions associated with the process 31.

A measurement system 34 is operatively associated with the process 31 to measure in-situ thickness of portions of the ultra-thin resist and/or hardmask while they are being patterned (developed or etched). That is, the measurement system 34 includes a thickness monitoring portion 36, which may be located within (or be integrated into) the process 31, such as may include an enclosed processing chamber. The measurement system 34, for example, samples the thickness of the ultra-thin resist or hardmask being patterned on the substrate at one or more locations, such as near the center and near one or more edge locations of the substrate. In particular, it may be desirable to obtain measurements from two or more spaced apart locations, such as at the center and one or more edge positions. Such measurements may enable a better determination as to uniformity of the thickness, which in accordance with an aspect of the present invention, may be employed to adjust the in situ developer etch process to achieve a desired level of uniformity of thickness.

The measurement system 34 may implement any known technique operable to measure the thickness of the thin film being formed in the process 31. Examples of techniques that may be utilized in accordance with an aspect of the present invention include scatterometry, ellipsometry, UV/vis spectrophotometry, x-ray reflectometry, and the like.

By way of further illustration, scatterometry may be employed to extract information about a surface of a substrate upon which an incident light has been directed. One or more gratings may be located on a substrate. Such gratings may be formed on the substrate, for example, at the same stage in patterning when alignment markers are formed thereon, such as by etching. Light reflected, and/or passed through, the one or more gratings and/or features is collected by one or more light detecting components of the measurement system 34. It is to be appreciated that any suitable scatterometry system may be employed to carry out the present invention, and such systems are intended to fall within the scope of the claims.

Those skilled in the art will understand and appreciate other techniques that also could be employed for performing in-situ thickness measurements, all of which are contemplated as falling within the scope of the present invention. The particular technique utilized in the system 30 may further vary according the type of ultra-thin resist or hardmask and thickness of the ultra-thin resist or hardmask in the process 31.

The measurement system 34 is coupled to the control system 32 for providing a signal indicative of the measured thickness of the ultra-thin resist or hardmask being patterned in the process 31. The control system 32, for example, includes memory (not shown) for storing a target thickness, which may vary according to the process. For example, by examining a signal (signature) library of intensity/phase signatures, a determination can be made concerning the properties of the surface, such as the decreasing thickness of portions of the ultra-thin resist or hardmask developed/etched. The control system 32 may be programmed and/or configured to compare the measured thickness relative to the target thickness and determine what action (if any) should be taken to drive the process 31 so that a target thickness and/or a desired level of uniformity of thickness may be achieved.

The system 30 further may include one or more other process sensors 38 for monitoring process operating conditions and providing an indication of such conditions to the control system 32. The control system 32 thus is able to adjust process operating characteristics based on the measured thickness (e.g., based on a signal from the measurement system 34) and the sensed process operating conditions (e.g., based on a signal from the other process sensors 38). In this way, the control system 32 may selectively refine the patterning process 31 to accommodate variations in sensed process conditions and measured thickness at various stages of the film patterning process. For example, the control system 32 may adjust developer and etch solution flow rates, contact times, and/or temperature; based on the conditions monitored by the measurement system 34 and the sensor(s) 38. As a result, the system 30 is capable of achieving a more precise and/or uniform thickness without an increase in process steps to refine the process.

Figure 8:
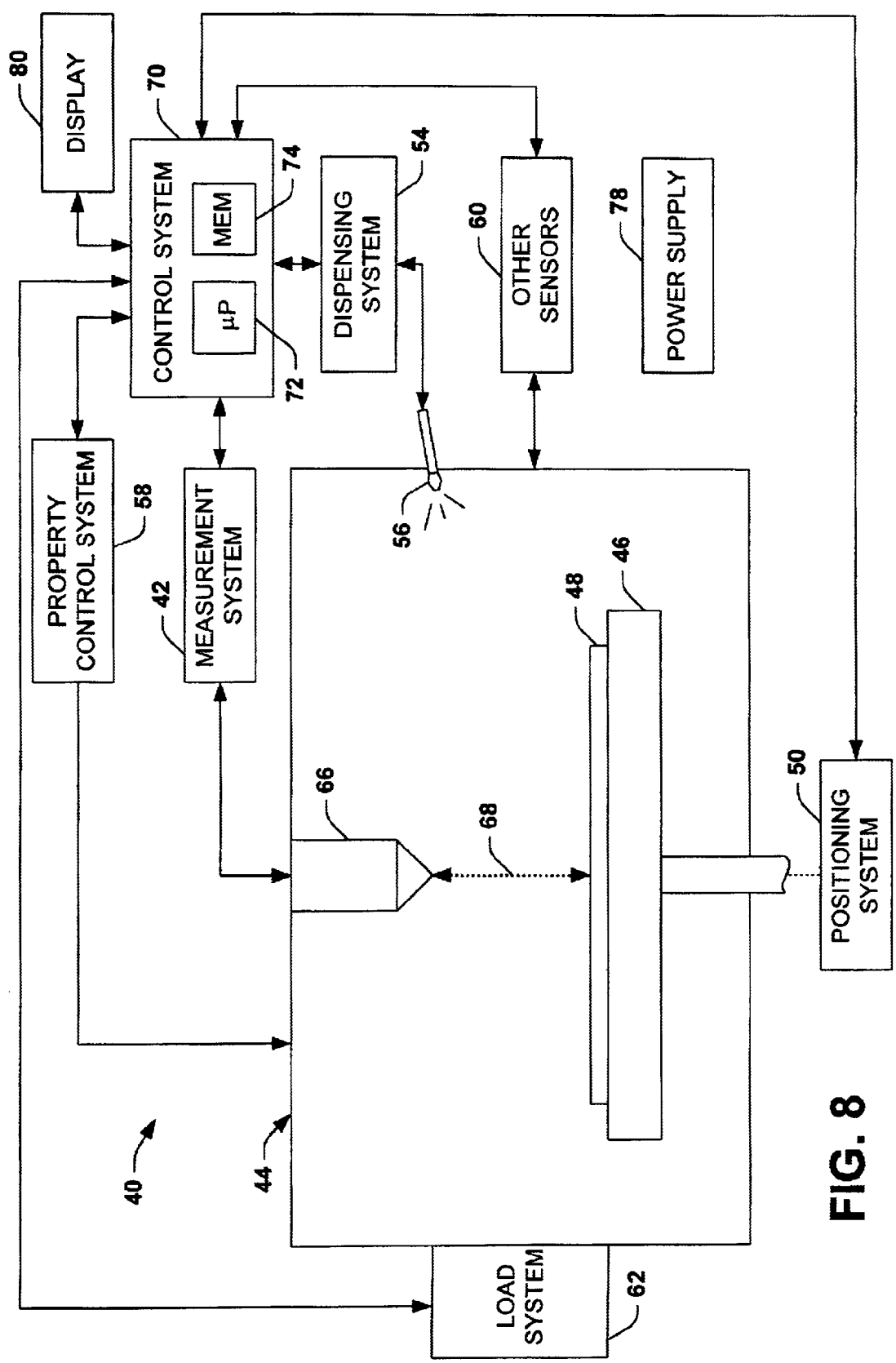
FIG. 8 is a functional block diagram of a a system in accordance with another aspect of the present invention.

FIG. 8 illustrates another example of a system 40 having a measurement system 42 for in-situ developer etch monitoring in accordance with an aspect of the present invention. The system 40 includes a process chamber 44 that includes a support, such as may include a stage 46 (or chuck) operative to support a substrate 48, such as a wafer. A positioning system 50 is operatively connected to the support 46 for positioning the stage 46 at a desired position within the chamber 44. It is to be appreciated that wafer positioning systems are rapidly evolving and that any such system may be employed in accordance with an aspect of the present invention.

A dispensing system 54 is operably coupled to the chamber 44 for selectively providing the materials to pattern the ultra-thin resist or hardmask on the substrate 48. By way of illustration, the dispensing system 54 includes a source of at least one developer and/or etch solution.

A property control system 58 also is provided for controlling properties within the processing chamber 44. For example, the property control system 58 controls the temperature, atmosphere (gases and/or actinic radiation and the like), pressure, and the like. The property control system 58 may implement its own control process or such control may be implemented as part of other sensors 60 operatively associated with the processing chamber 44.

The system 40 also may include a load system 62 operatively connected to the chamber 44 for loading and unloading substrates (eg., wafers) into and out of the processing chamber. The load system 62 typically is automated to load and unload the wafers into the chamber at a controlled rate.

The measurement system 42 is operative to measure film thickness in-situ, in accordance with an aspect of the present invention. In the example illustrated in FIG. 5, the measurement system 42 is a non-destructive optical measurement system, such as may utilize one or more of scatterometry, ellipsometry, UV/vis spectrophotometry, x-ray reflectometry and like techniques. The measurement system 42 typically includes a beam source and detector, schematically collectively indicated at 66. The beam source/detector 66 is located above the substrate 48. The source portion provides a light beam 68 toward an exposed surface of the substrate 48 at which the ultra-thin resist or hardmask is being patterned. The reflected beam(s) 68, which is received at the detector portion of the source/detector 66, has beam properties (magnitude and/or phase) which may be employed to determine an indication of ultra-thin resist or hardmask thickness. A plurality of incident beams from one or more sources also may be directed at different spaced apart locations of the substrate to obtain corresponding measurements of ultra-thin resist or hardmask thickness substantially concurrently during the patterning process. The concurrent measurements, in turn, provide an indication of the uniformity of ultra-thin resist or hardmask/patterning/thickness across the substrate.

For the example of optical interference, the intensity of light over a selected wavelength varies as a function of ultra-thin resist or hardmask thickness. For spectroscopic ellipsometry, thickness varies based on the state of polarization of light reflected from the ultra-thin resist or hardmask, which is functionally related to the index of refraction of the material reflecting the beam 68.

By way of further illustration, the substrate 48 has gratings formed thereon, such as may be formed concurrently with alignment markings on the substrate. The gratings, for example, may range from about 10×10 μm to about 100×100 μm, such as depending on the type of measurement tool being employed. The measurement system, in turn, may employ a scatterometry technique using spectroscopic ellipsometry to measure thickness of ultra-thin resist or hardmask being patterned at the gratings. Thus, the measurement system 42 may measure properties of the wafer at opposed sides of the substrate 48 and near the center.

Using a scatterometry technique, for example, desired information concerning ultra-thin resist or hardmask patterning/thickness can be extracted by comparing the phase and/or intensity (magnitude) of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed, including ultra-thin resist or hardmask patterning/thickness.

Different combinations of the above-mentioned properties will have different effects on the phase and/or intensity of the incident light resulting in substantially unique intensity/phase signatures in the complex reflected and/or diffracted light. The measurement system 42 provides information indicative of the measured properties to a control system 70. Such information may be the raw phase and intensity information. Alternatively or additionally, the measurement system 42 may be designed to derive an indication of ultra-thin resist or hardmask thickness based on the measured optical properties and provide the control system 70 with a signal indicative of the measured ultra-thin resist or hardmask thickness according to the detected optical properties. The phase and intensity of the reflected light can be measured and plotted.

In order to determine ultra-thin resist or hardmask patterning/thickness, for example, measured signal characteristics may be compared with a signal (signature) library of intensity/phase signatures to determine properties of the surface and, in particular, concerning the ultra-thin resist or hardmask thickness in a given area. Such substantially unique phase/intensity signatures are produced by light reflected from, and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk,$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a particular type of ultra-thin resist or hardmask having a first thickness in a first area may generate a first signature while the same type of ultra-thin resist or hardmask having a different thickness in another area may generate a second signature, which is different from the first signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing, for example, over three hundred thousand phase/intensity signatures. Thus, when the phase/intensity signals are received from scatterometry detecting components, the phase/intensity signals can be pattern matched, for example, to the library of signals to determine whether the signals correspond to a stored signature. Interpolation between the two closest matching signatures further may be employed to discern a more accurate indication of thickness from the signatures in the signature library. Alternatively, artificial intelligence techniques may be employed to calculate desired parameters of the wafer under test based on the detected optical properties.

While, for purposes of simplicity of illustration, the beam shown in FIG. 8 is illustrated as being generally perpendicular relative to the substrate, it is to be appreciated that the beam 68 may be oriented at other angles relative to the substrate 48 with a corresponding detector positioned at an opposite side of the substrate for receiving the reflected beam. In addition, more than one beam may be directed toward the surface at different locations to measure thickness at such different locations and, in turn, provide a measure of uniformity of thickness across the substrate. The thickness of areas of the ultra-thin resist or hardmask being patterned on the substrate 48 thus is determined based on the optical properties (e.g., n and k) of the emitted and reflected beams 68.

The other sensors 60, for example, monitor and/or measure selected conditions processing environment within the chamber 44. The other sensors 60, for example, may include a temperature sensor, mass flow sensor for gases, a pressure sensor, etc.

The various other subsystems and sensors 54, 58, 60, 62 further may provide respective signals to and/or receive control signals from the control system 70. Signals from the associated process systems 42, 54, 58, 60, 62 may indicate sensed operating conditions of the patterning process and/or operating conditions associated with the respective systems. The control system 70 in turn analyzes the conditions indicated by the received signals to discern whether the patterning process is being performed within expected operating parameters. The control system 70 also controls operating characteristics associated with the patterning process being implemented within the processing chamber 44 by providing appropriate control signals to the associated systems and/or sensors 42, 54, 58, 60, 62. Such control signals thus may adjust operating parameters of the patterning process when one or more detected parameters, including thickness, are not within expected operating parameters (e.g., where thickness is not uniform in a certain discrete area).

By way of example, the control system 70 includes a processor 72, such as a microprocessor or CPU, coupled to a memory 74. The processor 72 receives measured data from the measuring system 42 and corresponding other data from the other sensors 60. The processor 72 also is operatively coupled to the dispensing system 54, the property control system 58, and the load station 62. The control system 70 is programmed and/or configured to control and operate the various components within the processing system 40 in order to carry out the various functions described herein.

The processor 72 may be any of a plurality of processors, such as the AMD K6, ATHLON or other processors. The manner in which the processor 72 can be programmed to carry out the functions relating to the present invention will be readily apparent to those having ordinary skill in the art based on the description provided herein.

The memory 74 serves to store program code executed by the processor 72 for carrying out operating functions of the system as described herein. The memory 74 may include read only memory (ROM) and random access memory (RAM). The ROM contains among other code the Basic Input-Output System (BIOS) which controls the basic hardware operations of the system 40. The RAM is the main memory into which the operating system and application programs are loaded. The memory 74 also serves as a storage medium for temporarily storing information such as temperature, temperature tables, pattern layouts, position coordinate tables, interferometry information, thickness tables, and algorithms that may be employed in carrying out the present invention. The memory 74 also can hold patterns against which observed data can be compared as well as information concerning grating sizes, grating shapes, scatterometry information, achieved profiles, desired profiles and other data that may be employed in carrying out the present invention. For mass data storage, the memory 74 may include a hard disk drive.

A power supply 78 provides operating power to the system 20. Any suitable power supply (e g., battery, line power) may be employed to carry out the present invention. The system further may include a display 80 operatively coupled to the control system 70 for displaying a representation (e.g., graphical and/or text) of one or more process conditions, such as ultra-thin resist or hardmask thickness, patterns, temperature, flow rates, contact time, etc. The display 80 further may show a graphical and/or textual representation of the measured optical properties (refractive index and/or absorption content) at various locations along the surface of the substrate.

As a result, the system 40 provides for monitoring process conditions, including ultra-thin resist or hardmask patter/ thickness and other sensed process-related conditions, associated with the in situ developer etch process within the chamber 44. The monitored conditions provide data based on which the control system 70 may implement feedback process control so as to form a patterned hardmask, including a uniform development/etching across the substrate.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing an ultra-thin resist, comprising:
    depositing the ultra-thin resist over a hardmask layer that is over a semiconductor substrate, the ultra-thin resist having a thickness less than about 5,000 Å;
    irradiating the ultra-thin resist with electromagnetic radiation having a wavelength of about 250 nm or less;
    developing the ultra-thin resist with a developer to form a patterned resist, wherein the ultra-thin resist is not dried; and
    etching the hardmask layer with an etch solution within about 1 minute after developing to provide a patterned hardmask.

2. The method of claim 1, wherein the ultra-thin resist has a thickness of less than about 3,000 Å.

3. The method of claim 1, wherein the hardmask layer has a thickness of about 100 Å or more and about 5,000 Å or less.

4. The method of claim 1, wherein the hardmask layer comprises an oxide and the etch solution comprises a buffered oxide etch solution or an HF solution.

5. The method of claim 1, wherein the hardmask layer comprises a nitride and the etch solution comprises a phosphoric acid solution.

6. The method of claim 1, wherein the hardmask layer comprises a metal containing material and the etch solution comprises a peroxide solution.

7. The method of claim 1, wherein the metal containing material comprises at least one selected from the group consisting of titanium, titanium nitride, tungsten, tantalum, and tantalum nitride.

8. The method of claim 1, wherein the electromagnetic radiation has a wavelength of about 200 nm or less.

9. The method of claim 1, wherein the electromagnetic radiation comprises at least one of light having a wavelength about 248 nm, about 193 nm, about 157 nm, about 13 nm, about 11 nm, or about 1 nm, and e-beams.

10. The method of claim 1, wherein the hardmask layer within about 30 seconds after developing.

11. The method of claim 1, further comprising rinsing the patterned resist with a solution comprising deionized water just prior to etching the hardmask layer.

* * * * *